(12) United States Patent
Kim et al.

(10) Patent No.: US 6,400,216 B1
(45) Date of Patent: Jun. 4, 2002

(54) MULTI-DRIVING APPARATUS BY A MULTI-LEVEL DETECTION AND A METHOD FOR CONTROLLING THE SAME

(75) Inventors: Hack Soo Kim; Saeng Hwan Kim, both of Ichon-shi (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/718,402

(22) Filed: Nov. 24, 2000

Related U.S. Application Data

(63) Continuation of application No. 09/215,254, filed on Dec. 18, 1998, now Pat. No. 6,236,261.

(30) Foreign Application Priority Data

Dec. 31, 1997 (KR) ............................................. 97-81299

(51) Int. Cl.[7] ................................................. H01J 19/82
(52) U.S. Cl. ....................................... 327/548; 327/536
(58) Field of Search ................................. 327/535, 536, 327/538, 540, 541, 543, 548

(56) References Cited

U.S. PATENT DOCUMENTS

| | | | | |
|---|---|---|---|---|
| 4,961,007 A | * | 10/1990 | Kumanoya et al. | 323/313 |
| 4,964,082 A | * | 10/1990 | Sato et al. | 327/534 |
| 5,034,625 A | * | 7/1991 | Min et al. | 327/536 |
| 5,072,134 A | * | 12/1991 | Min | 327/536 |
| 5,396,114 A | * | 3/1995 | Lee et al. | 323/313 |
| 5,434,820 A | * | 7/1995 | Kim | 327/535 |
| 5,452,253 A | * | 9/1995 | Choi | 365/189.09 |
| 5,461,591 A | * | 10/1995 | Kim et al. | 327/534 |
| 5,506,540 A | * | 4/1996 | Sakurai et al. | 327/534 |
| 5,706,230 A | * | 1/1998 | Lee | 327/534 |
| 5,959,854 A | * | 9/1999 | Okada | 327/536 |
| 5,969,565 A | * | 10/1999 | Naganawa | 327/536 |
| 5,982,222 A | * | 11/1999 | Kyung et al. | 327/536 |
| 6,128,242 A | * | 10/2000 | Banba et al. | 365/226 |
| 6,208,198 B1 | * | 3/2001 | Lee | 327/536 |
| 6,275,096 B1 | * | 8/2001 | Hsu et al. | 327/534 |

* cited by examiner

*Primary Examiner*—Jeffrey Zweizig
(74) *Attorney, Agent, or Firm*—Nath & Associates PLLC; Gary M. Nath; Marvin C. Berkowitz

(57) ABSTRACT

A multi-driving apparatus by a multi-level detection which pluralizes a voltage detection level in order to effectively operate voltage generators in the voltage generation circuit, minimizes a level fluctuation, reduces noise influenced on a total operation of the apparatus, increases a reliability of the apparatus, and reduces the power-consumption. The multi-driving apparatus includes: a level detection circuit block which receives a step-up voltage VPP or a back-bias voltage VBB as an input, and detects different level potentials; a control circuit block for controlling an operation of each generator according to a detected potential by the level detection circuit block; an oscillation circuit block which is oscillated by an enable signal being output from the control circuit block, and generates electric vibrations; and a generation circuit block which receives a control signal from the control circuit block as an input, and is comprised of a plurality of generators being driven by an oscillation output from the oscillation circuit block.

5 Claims, 25 Drawing Sheets

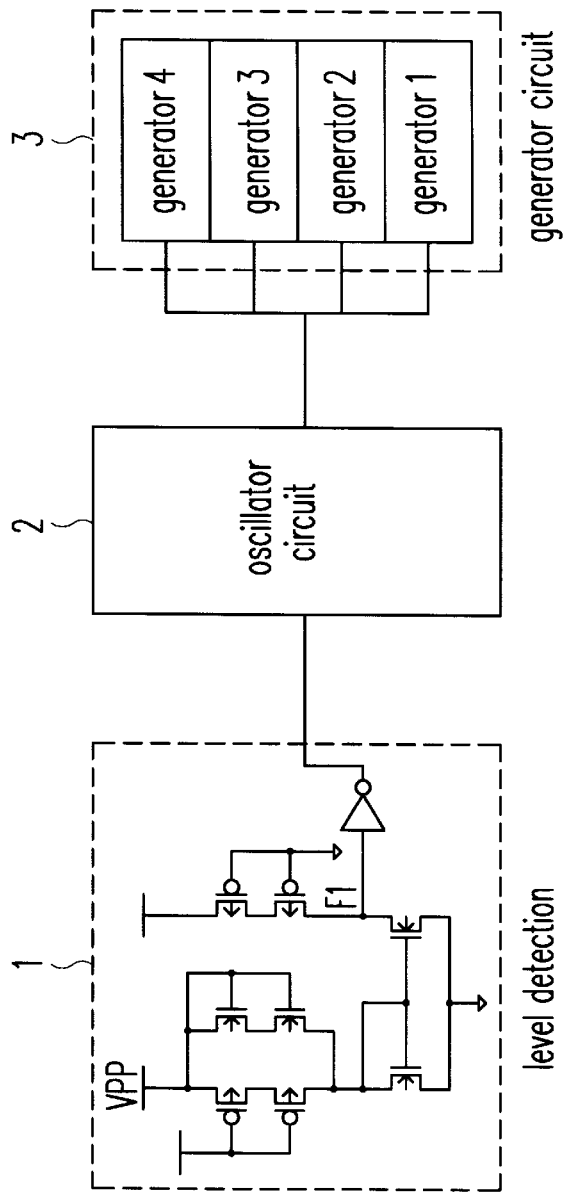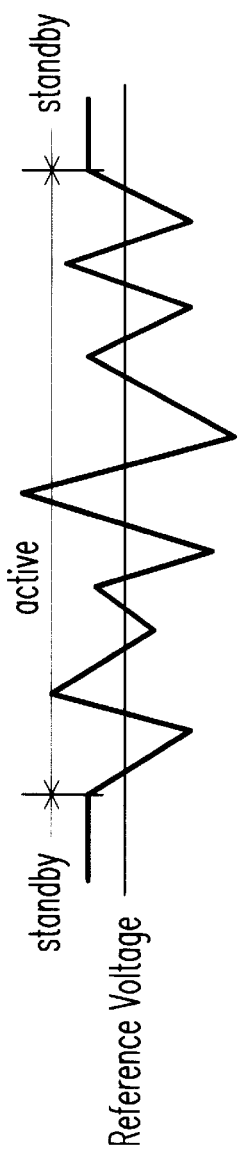
Fig. 1A (Prior Art)
Fig. 1B (Prior Art)

| | LEVEL1 | LEVEL2 | generator 1 enable | generator 2 enable | oscillator enable |
|---|---|---|---|---|---|
| case 1 | L | L | H | H | H |
| case 2 | H | L | L | H | H |
| case 3 | H | H | L | L | L |
| case 4 | H | L | L | H | H |
| case 5 | L | L | H | H | H |

MULTI-DRIVING APPARATUS BY A MULTI-LEVEL DETECTION AND A METHOD FOR CONTROLLING THE SAME

This application is a continuation of U.S. patent application Ser. No. 09/215,254, filed Dec. 18, 1998, now U.S. Pat. No 6,236,261 entire contents of which are hereby incorporated herein in their entirety.

BACKGROUND OF THE INVENTION

1. Field of the Invention

The present invention relates to a voltage generation circuit. More particularly, it relates to a multi-driving apparatus by a multi-level detection and a method for controlling the same, which pluralize a voltage detection level in order to effectively operate voltage generators in the voltage generation circuit, minimize a level fluctuation, reduce noises that affect the operation of the apparatus, increase the reliability of the apparatus, and reduce power-consumption.

2. Description of the Prior Art

A conventional voltage generation circuit will now be described with reference to FIGS. 1A–1B.

FIG. 1A is a block diagram of a conventional voltage generation circuit; and FIG. 1B is a conceptional diagram of a conventional voltage generation circuit shown in FIG. 1A.

As shown in FIG. 1A, the conventional voltage generation circuit includes: a level detection portion 1 for detecting a level potential of an input step-up voltage VPP; an oscillation circuit 2 which is oscillated by an enable signal being output in response to an output potential signal of the level detection portion 1, and generates electric vibrations; and a generation circuit 3 for operating a plurality of generators by an output oscillation signal of the oscillation circuit 2.

The aforementioned conventional voltage generation circuit has a single detection level as shown in FIG. 1B, and simultaneously operates the plurality of generators in the generation circuit 3.

Accordingly, since many generators are operated at the same time, the conventional voltage generation circuit has a momentary power-consumption of a high value, and fluctuations in the voltage level often occurs.

If a voltage level is not stabilized and an excessive voltage fluctuation occurs, a fatal damage may be experienced by the apparatus.

For example, if a level of the step-up voltage VPP fluctuates excessively, a gate oxide film of a transistor using the level of the step-up voltage VPP may be destroyed.

Also, since a level fluctuation of a back-bias voltage VBB changes the threshold voltage of the transistor, a leakage current increases and a fatal problem such as a latch-up occurs, thereby causing a malfunction in the apparatus.

Following the current trend of requiring the products to use a low-voltage and low-power, a level stabilization of the voltage generator is very important.

SUMMARY OF THE INVENTION

Accordingly, the present invention is directed to a multi-driving apparatus by a multi-level detection and a method for controlling the same that substantially obviate one or more of the problems due to the limitations and disadvantages of the related art.

It is an object of the present invention to provide a multi-driving apparatus by a multi-level detection and a method for controlling the same, which pluralize a voltage detection level in order to effectively operate voltage generators in the voltage generation circuit, minimize a level fluctuation, reduce noises influenced on a total operation of the apparatus, increase the reliability of the apparatus, and reduce power-consumption.

To achieve the above object, a multi-driving apparatus by a multi-level detection according to the present invention includes: a level detection circuit block which receives a step-up voltage VPP or a back-bias voltage VBB as an input, and detects different level potentials; a control circuit block for controlling an operation of each generator according to a detected potential by the level detection circuit block; an oscillation circuit block which is oscillated by an enable signal outputted from the control circuit block, and generates electric vibrations; and a generation circuit block which receives a control signal from the control circuit block as an input, and is comprised of a plurality-of generators being driven by an oscillation output from the oscillation circuit block.

Also, a multi-driving method by a multi-level detection according to the present invention includes the steps of: (a) receiving a step-up voltage VPP or a back-bias voltage VBB as an input, and detecting different level potentials; (b) controlling each enable signal according to a detected level potential by the step (a); (c) receiving the enable signal from the step (b) as an input, and generating electric vibrations by an oscillation of an oscillator; and (d) driving a plurality of voltage generators by an oscillation output from the step (c).

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which:

FIG. 1A is a block diagram of a conventional voltage generating circuit;

FIG. 1B is a conceptional diagram of a conventional voltage generating circuit shown in FIG. 1A;

DETAILED DESCRIPTION OF THE PREFERRED EMBODIMENT

A preferred embodiment of the present invention will now be described in detail with reference to the accompanying drawings.

Figure 2A:
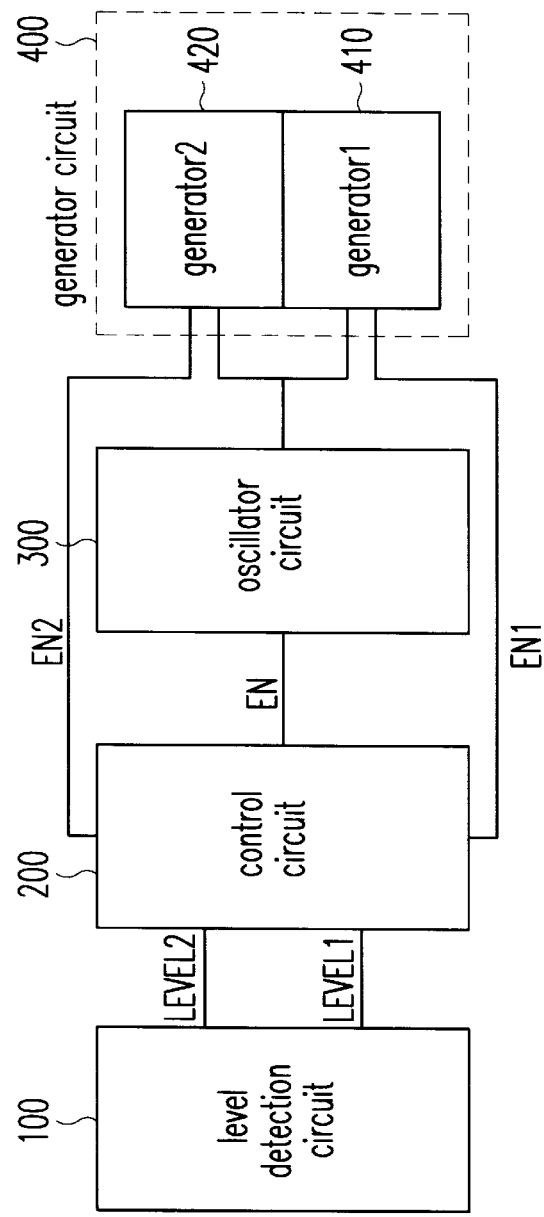
FIG. 2A is a block diagram of a multi-driving apparatus by a multi-level detection in accordance with the present invention.
Figure 2B:
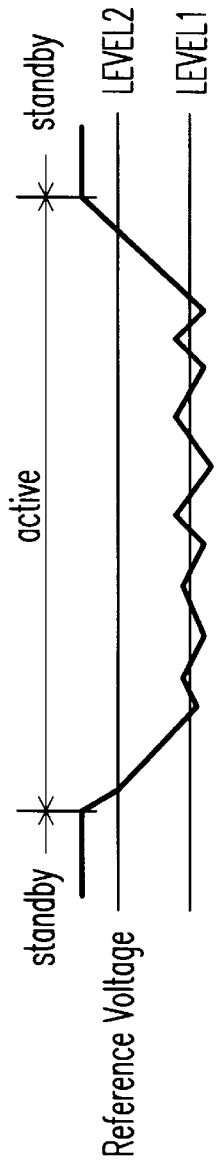
FIG. 2B is a conceptional diagram of the multi-driving apparatus shown in FIG. 2A in accordance with the present invention.

FIG. 2A is a block diagram of a multi-driving apparatus by a multi-level detection in accordance with the present invention.

As shown in FIG. 2A, the multi-driving apparatus by a multi-level detection includes: a level detection circuit block 100 which receives a step-up voltage VPP or a back-bias voltage VBB as an input, and detects different level potentials; a control circuit block 200 for controlling an operation of each generator according to a detected potential by the level detection circuit block 100; an oscillation circuit block 300 which is oscillated by an enable signal from the control circuit block 200, and generates electric vibrations; and a generation circuit block 400 which receives a control signal from the control circuit block 200 as an input, and is comprised of a plurality of generators being driven by an oscillation output from the oscillation circuit block 300.

The above multi-driving apparatus by a multi-level detection according to the present invention will be operated as follows.

In order to solve a power-consumption and a level fluctuation being generated when the conventional art simultaneously operates a plurality of generators after sensing a single level, the multi-driving apparatus effectively drives the generator circuits by pluralizing a detection level, thereby minimizing the level fluctuation and reducing unnecessary power-consumption.

According to the present invention, a control circuit block 200 outputs a signal to control each generator, wherein a step-up voltage (VPP) level detection circuit block 100 generates many levels (e.g., 2 levels).

Figure 3A:
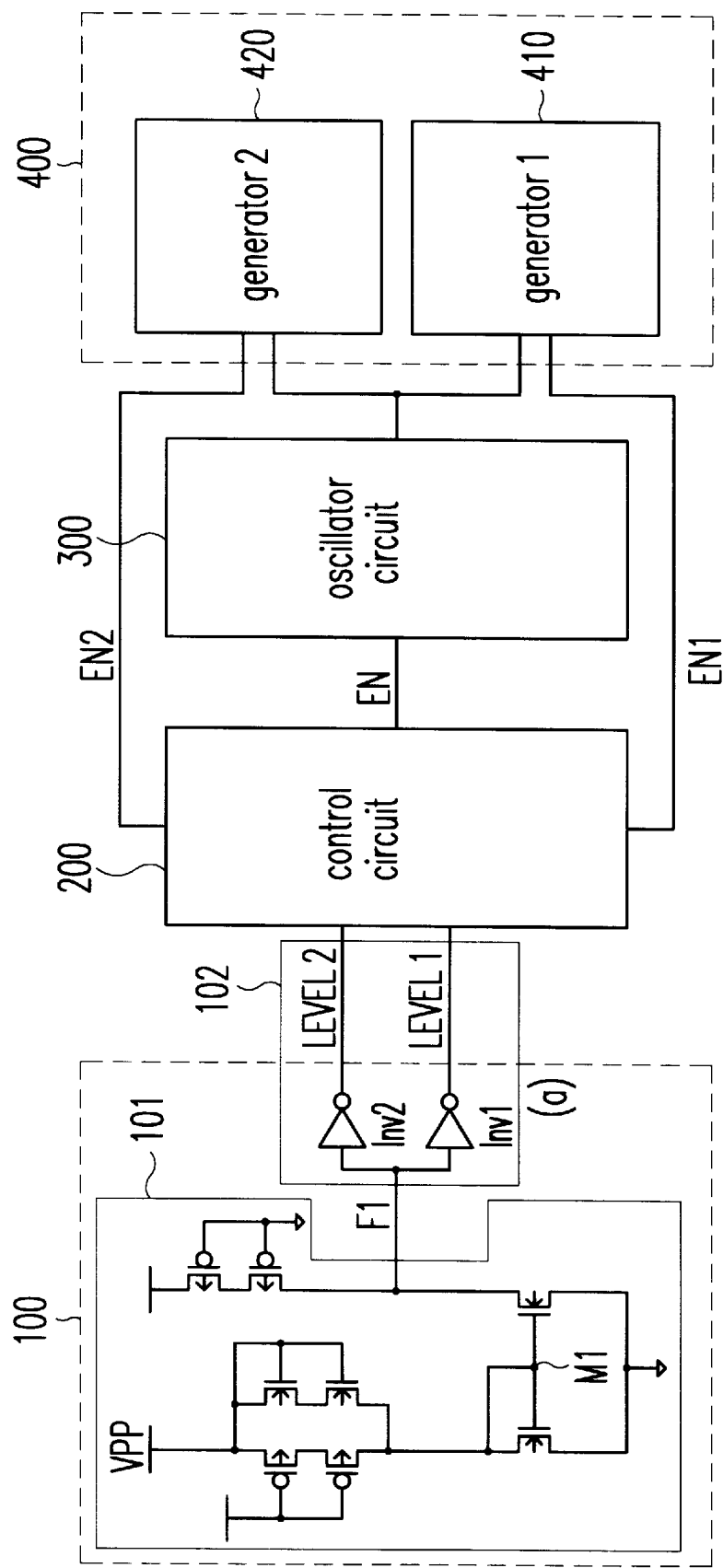
FIGS. 3A–D is a block diagram of various step-up voltage (VPP) level detection circuit blocks in accordance with the present invention.

FIG. 3A is a block diagram of the step-up voltage (VPP) level detection circuit block 100 in accordance with the present invention.

As shown in FIG. 3A the VPP level detection circuit block 100 includes: a switching transistor portion 101 which is switched on or off according to a feedback voltage; and a level potential output portion 102 which receives an output voltage from the switching transistor portion 101 as an input, and outputs two level potentials different from each other through inverters.

Referring to FIG. 3A which shows a preferred embodiment, a first inverter INV1 and a second inverter INV2 have a different switching point, thereby generating a level 1 and a level 2, respectively.

Figure 3B:
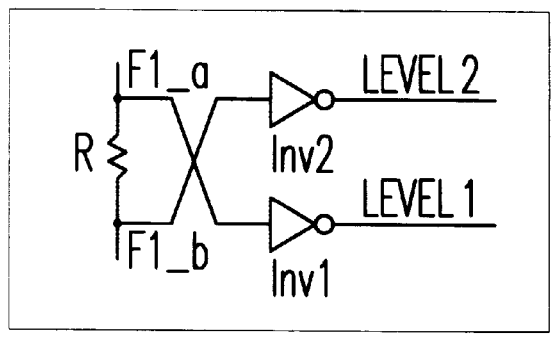
Figure 3C:
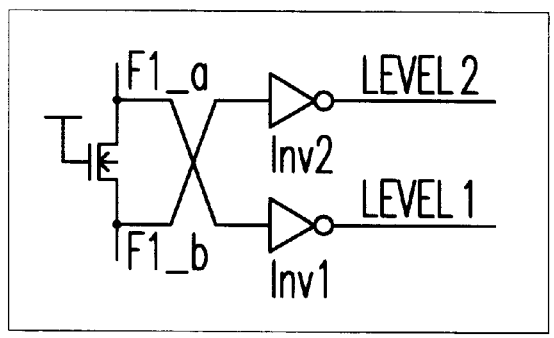
Figure 3D:
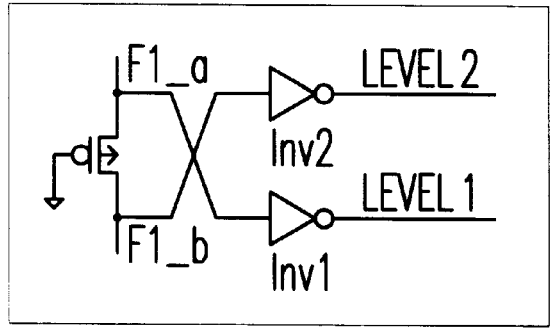

Referring to FIGS. 3B, 3C and 3D which show another preferred embodiment, the first inverter INV1 and the second inverter INV2 use the same switching point, thereby generating a level 1 and a level 2, respectively.

In the above preferred embodiments shown in FIGS. 3A–3D, let us suppose that level 2 is always higher than level 1.

The VPP level detection circuit block 100 will be operated as follows. If a lower voltage than level 1 is fed to the VPP level detection circuit block 100, a node M1 of a switching transistor portion 101 becomes a low level, a node F1 of the switching transistor portion 101 becomes a high level; thus, level 1 and level 2 become a low level by the first inverter INV1 and the second inverter INV2 of the level potential output portion 102.

The control circuit block 200 receives level 1 and level 2 as an input, and drives a first generator 410 and a second generator 420 of the generation circuit block 400.

On the contrary, if a step-up voltage VPP between level 1 and level 2 is fed to the VPP level detection circuit block 100, the node M1 of the switching transistor portion 101 has an intermediate level between the low level and high level. Accordingly, the level 1 becomes a high level via the first inverter INV1, and level 2 becomes a low level via the second inverter INV2.

As a result, the first generator 410 of the generation circuit block 400 is turned off, and the second generator 420 of the generation circuit block 400 is turned on.

In addition, if a step-up voltage VPP is higher than the level 2 and fed to the VPP level detection circuit block 100, the node M1 of the switching transistor portion 101 becomes a high level, the node F1 becomes a low level; and the level 1 and level 2 become a high level by the first inverter INV1 and the second inverter INV2 of the level potential output portion 102. Thus, the first and second generators 410 and 420 in the generation circuit block 400 are turned off.

Figure 4A:
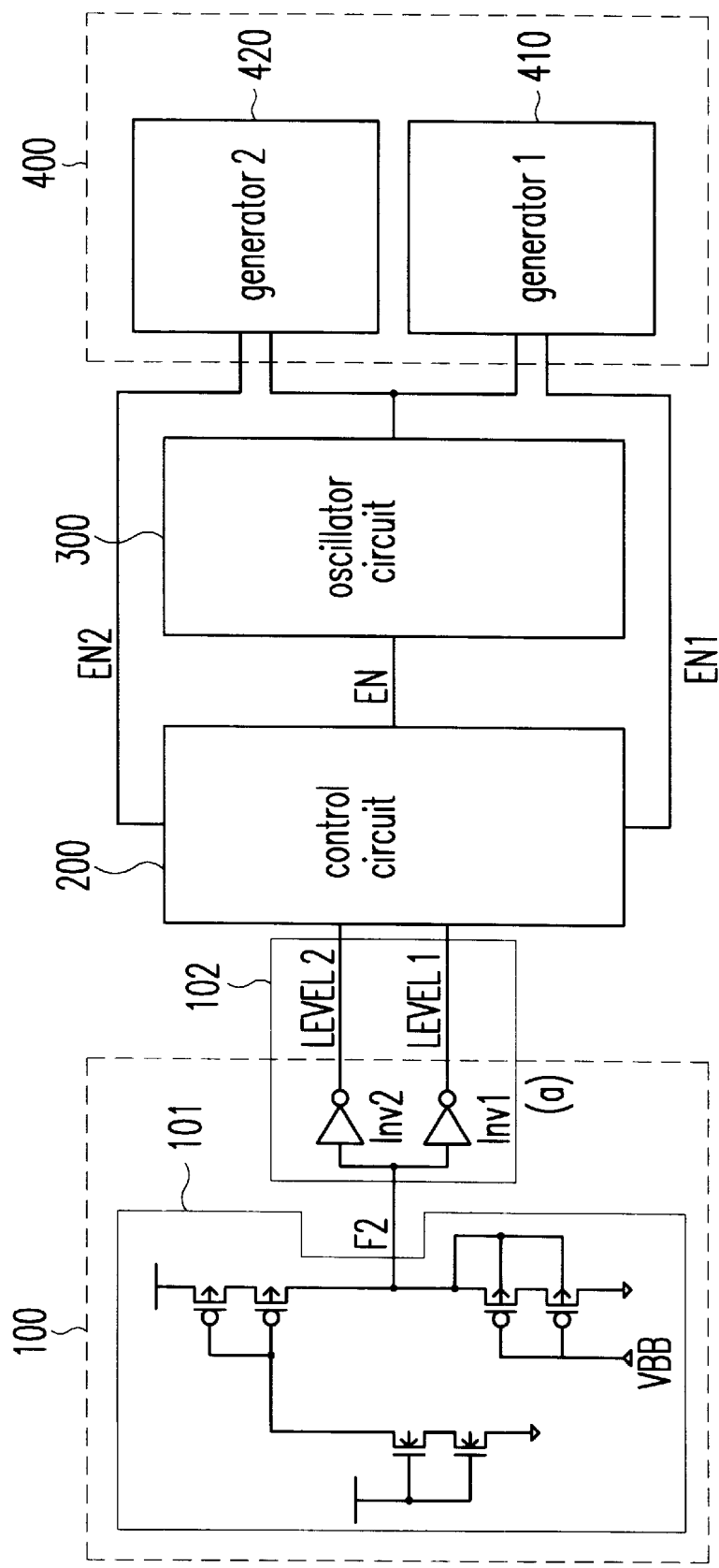
FIGS. 4A–D is a block diagram of various back-bias voltage (VBB) level detection circuit blocks in accordance with the present invention.

FIG. 4A depicts a back-bias voltage (VBB) level detection circuit block in 100 generally use, and shows a method for making many levels (e.g., 2 levels).

Figure 4B:
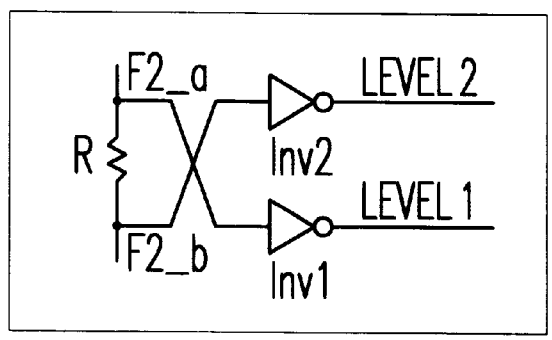
Figure 4C:
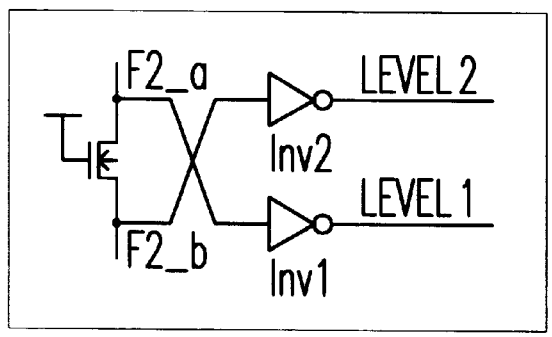
Figure 4D:
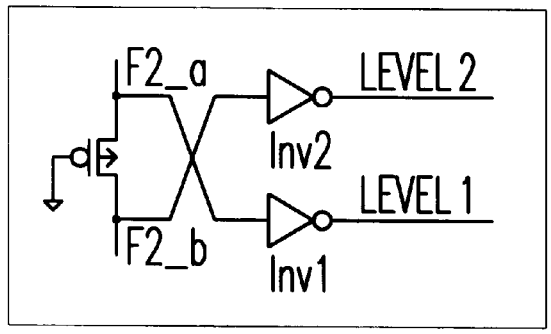

In operation, the inverters INV1 and INV2 respectively have a different switching point in FIG. 4A, and the two inverters INV1 and INV2 have the same switching point in FIGS. 4A–4C.

During the operation of the back-bias voltage (VBB) level detection circuit block 100, if a back-bias voltage VBB is higher than the level 2 and fed to the VBB level detection circuit block 100, a node F2 of a switching transistor portion 101 becomes a high level.

Accordingly, level 1 and level 2 become low level by the first inverter INV1 and second inverter INV2; thus, the first and second generators 410 and 420 in the generation circuit block 400 are operated.

Also, if a back-bias voltage VBB between the level 1 and level 2 is fed to the VBB level detection circuit block 100, level 1 becomes a low level, and level 2 becomes a high level. Therefore, the first generator 410 in the generation circuit block 400 is turned on, and the second generator 420 in the generation circuit block 400 is turned off.

Finally, if a back-bias voltage VBB is lower than the level 1 is fed to the VBB level detection circuit block 100, the node F2 of the switching transistor portion 101 becomes a low level. Accordingly, level 1 and level 2 become high level, and the first and second generators 410 and 420 in the generation circuit block 400 are turned off.

Figure 5:
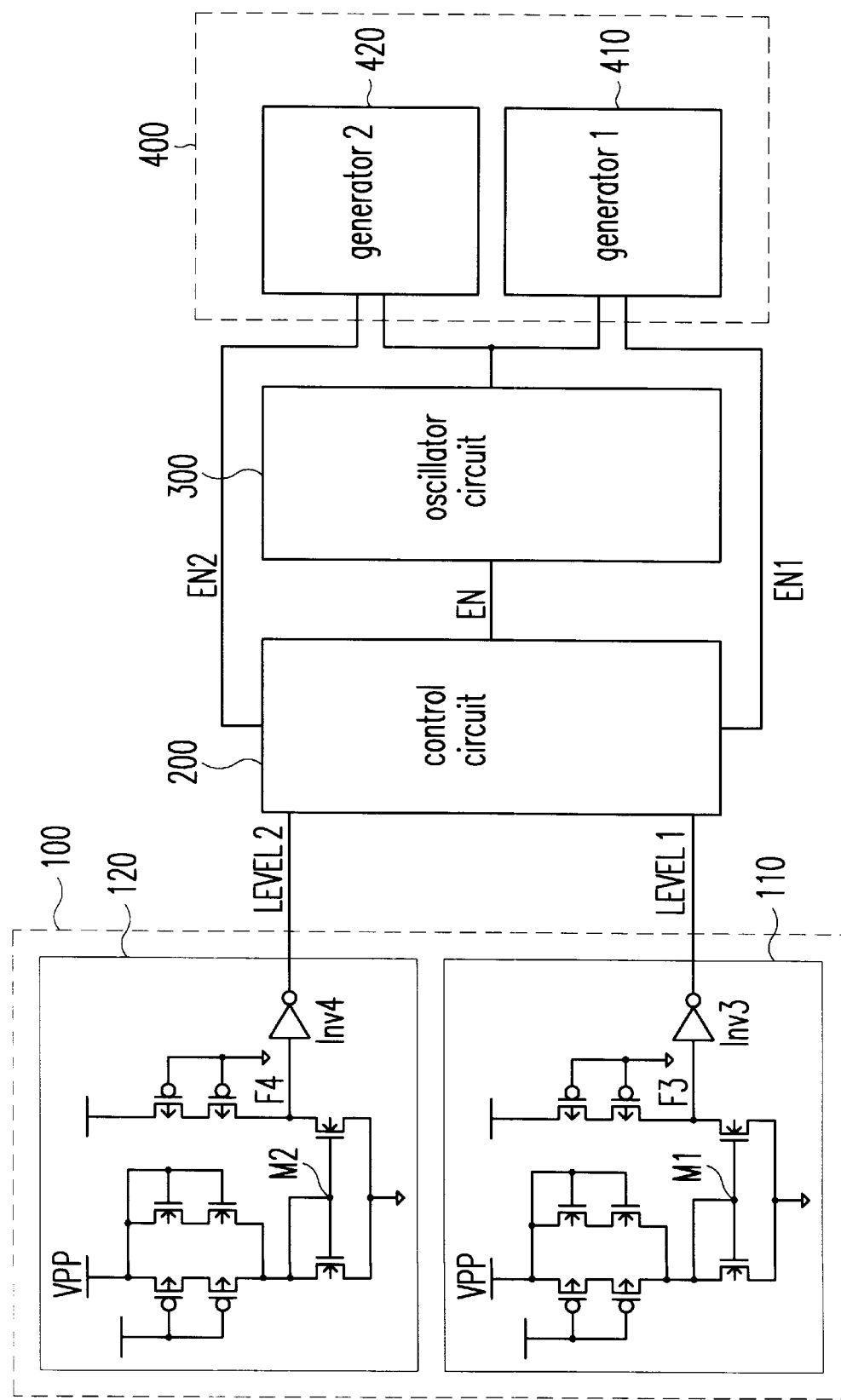
FIG. 5 illustrates another embodiment of the step-up voltage (VPP) level detection circuit blocks of FIG. 3 in accordance with the present invention.

FIG. 5 illustrates another embodiment of the step-up voltage (VPP) level detection circuit block 100 of FIG. 3 in accordance with the present invention, in which level 1 and level 2 are obtained by using a first step-up voltage (VPP) level detector 110 and a second step-up voltage (VPP) level detector 120.

In operation, if the step-up voltage VPP lower than the level 1 is fed to the VPP level detection circuit block 100, a node M1 of the first VPP level detector 110 and a node M2 of the second VPP level detector 120 become low level, two nodes F3 and F4 become high level. Thus, level 1 and level 2 become a low level by a third inverter INV3 and a fourth inverter INV4.

Accordingly, level 1 and level 2 are inputted to the control circuit block 200; thus, the first generator 410 and the second generator 420 in the generation circuit block 400 are driven.

On the contrary, if a step-up voltage VPP between level 1 and level 2 is fed to the VPP level detection circuit block 100, the node M1 of the first VPP level detector 110 becomes a high level, and the node M2 of the second VPP level detector 120 becomes a low level.

Accordingly, node F3 becomes a low level; node F4 becomes a high level; level 1 becomes a high level by the third inverter INV3; and level 2 becomes a low level by the fourth inverter INV4.

Since level 1 and level 2 are inputted to the control circuit block 200, the first generator 410 of the generation circuit block 400 is turned off, and a second generator 420 of the generation circuit block 400 is turned on.

In addition, if a step-up voltage VPP, which is higher than level 2, is fed to the VPP level detection circuit block 100, the node M1 of the first VPP level detector 110 and the node M2 of the second VPP level detector 120 become high level, the nodes F3 and F4 become low level, and level 1 and level 2 become high level by the third inverter INV3 and the fourth inverter INV4. As a result, the first and second generators 410 and 420 in the generation circuit block 400 are turned off.

Figure 6:
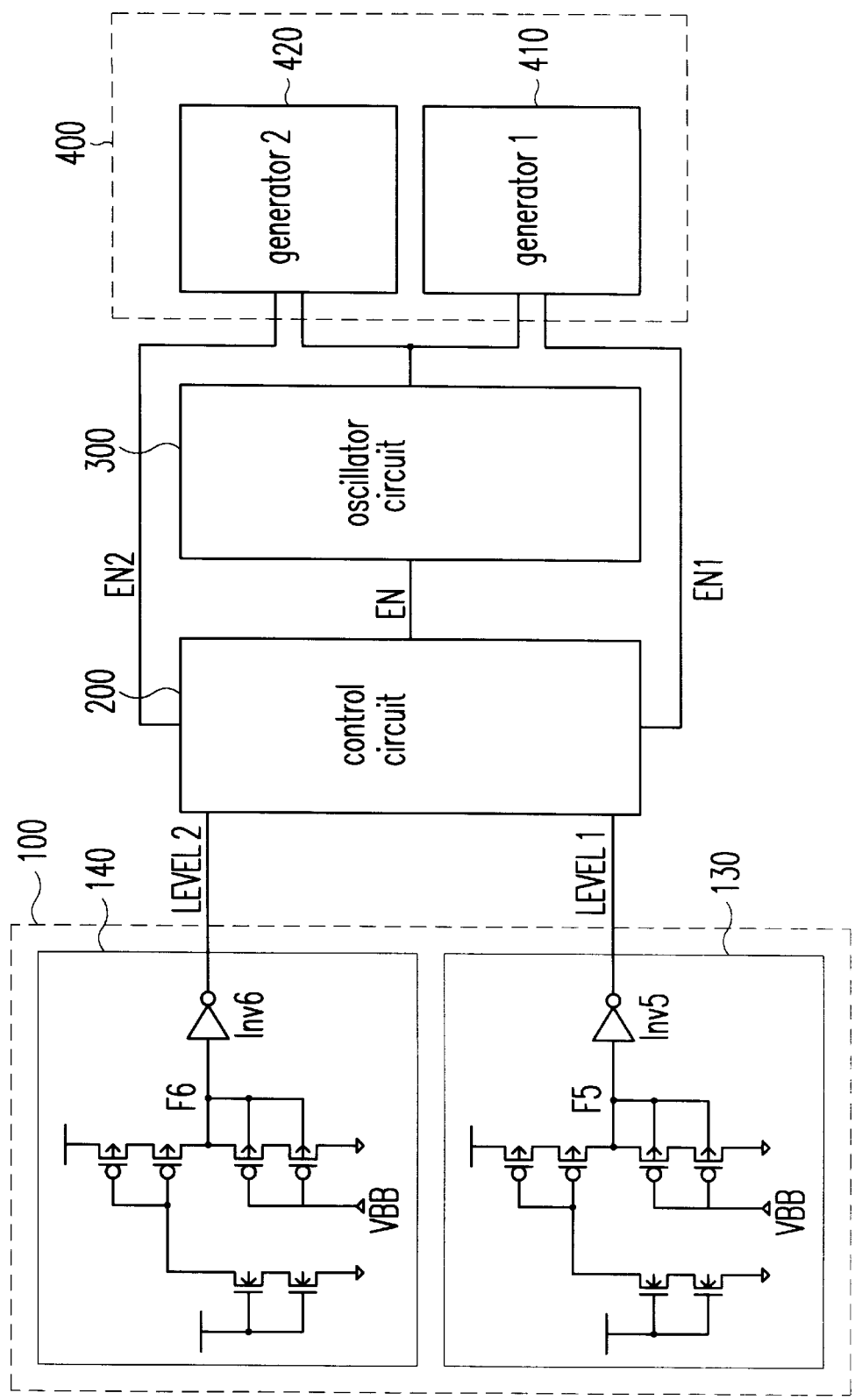
FIG. 6 illustrates another embodiment of the back-bias voltage (VBB) level detection circuit blocks of FIG. 4 in accordance with the present invention.

FIG. 6 illustrates another embodiment of the back-bias voltage (VBB) level detection circuit block 100 of FIG. 4 in accordance with the present invention, in which the level 1 and the level 2 are obtained by using a first VBB level detector 130 and second VBB level detector 140.

In operation, if the back-bias voltage VBB, which is lower than the level 1, is fed to the VBB level-detection circuit block 100, node F5 of the first VBB level detector 130 and node F6 of the second VBB level detector 140 become high level; thus, level 1 and level 2 become low level by the fifth inverter INV5 and sixth inverter INV6.

Accordingly, level 1 and level 2 are inputted to the control circuit block 200; thus, the first and second generators 410 and 420 in the generation circuit block 400 are operated.

On the contrary, if a back-bias voltage VBB between the level 1 and the level 2 is fed to the VBB level detection circuit block 100, node F5 of the first VBB level detector 130 becomes a low level, and a node F6 of the second VBB level detector 140 becomes a high level. Therefore, level 1 becomes a high level by the fifth inverter INV5, and level 2 becomes a low level by the sixth inverter INV6.

If level 1 and level 2 are inputted to the control circuit block 200, the first generator 410 in the generation circuit block 400 is turned off, and the second generator 420 in the generation circuit block 400 is turned on.

In addition, if a back-bias voltage VBB higher than the level 2 is fed to the VBB level detection circuit block 100, the node F5 of the first VBB level detector 130 and the node F6 of the second VBB level detector 140 become low level, therefore, level 1 and level 2 become high level by the fifth inverter INV5 and sixth inverter INV6.

As a result, the first and second generators 410 and 420 in the generation circuit block 400 are turned off.

Figure 7:
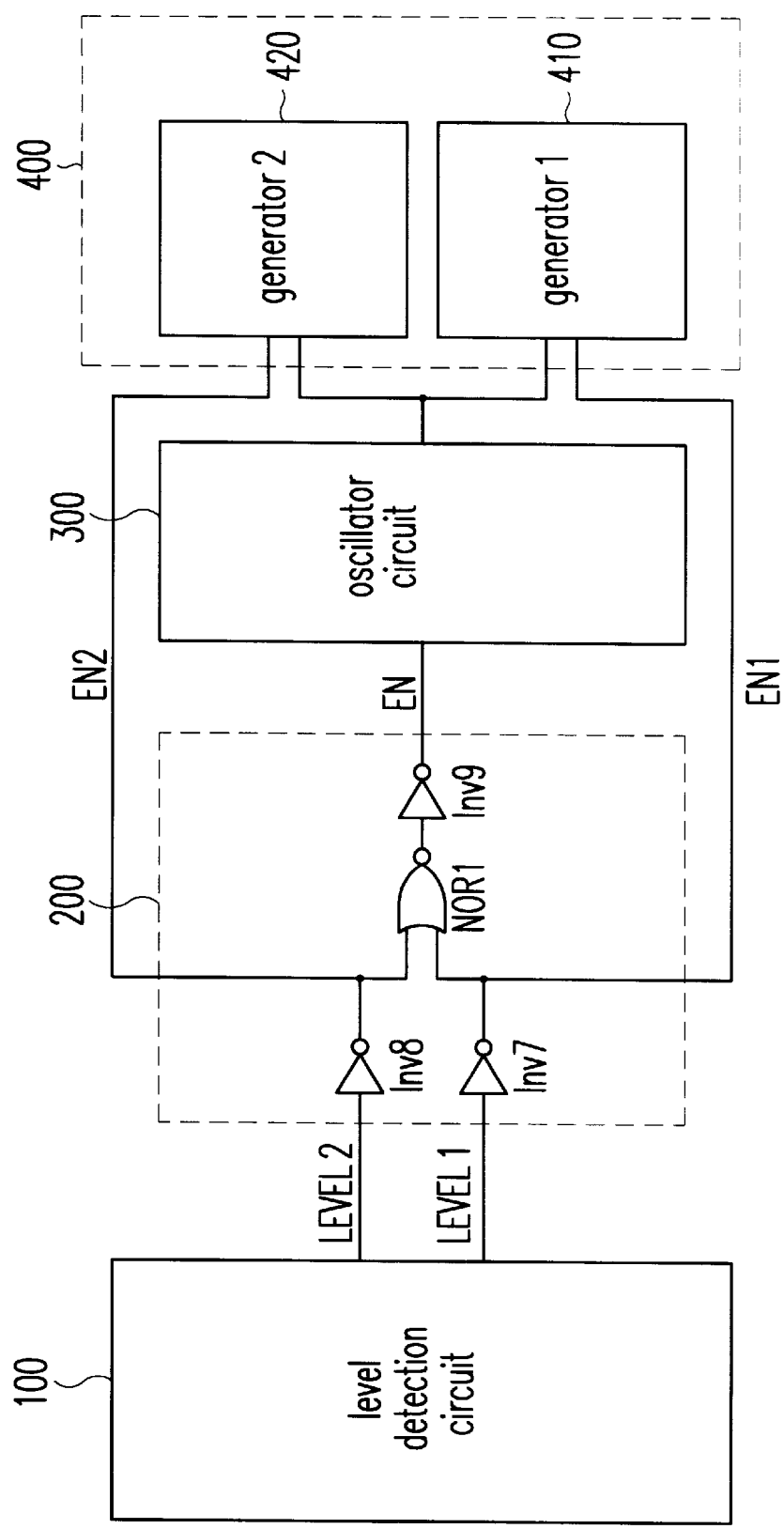
FIG. 7 is a block diagram of a control circuit block using NOR gate in accordance with the present invention;.

FIG. 7 is a block diagram of a control circuit block 200 using NOR gate NOR1 in accordance with the present invention.

As shown in FIG. 7, the control circuit block 200 includes:

a NOR gate NOR1 which receives a level 1 inverted by an inverter INV7 and a level 2 inverted by an inverter INV8 as an input, and performs a NOR operation for level 1 and level 2; and an inverter INV9, which receives an output signal of the NOR gate NOR1 as an input, inverts the output signal of the NOR gate NOR1, and outputs an oscillator enable signal EN to an oscillation circuit block 300.

Figure 8:
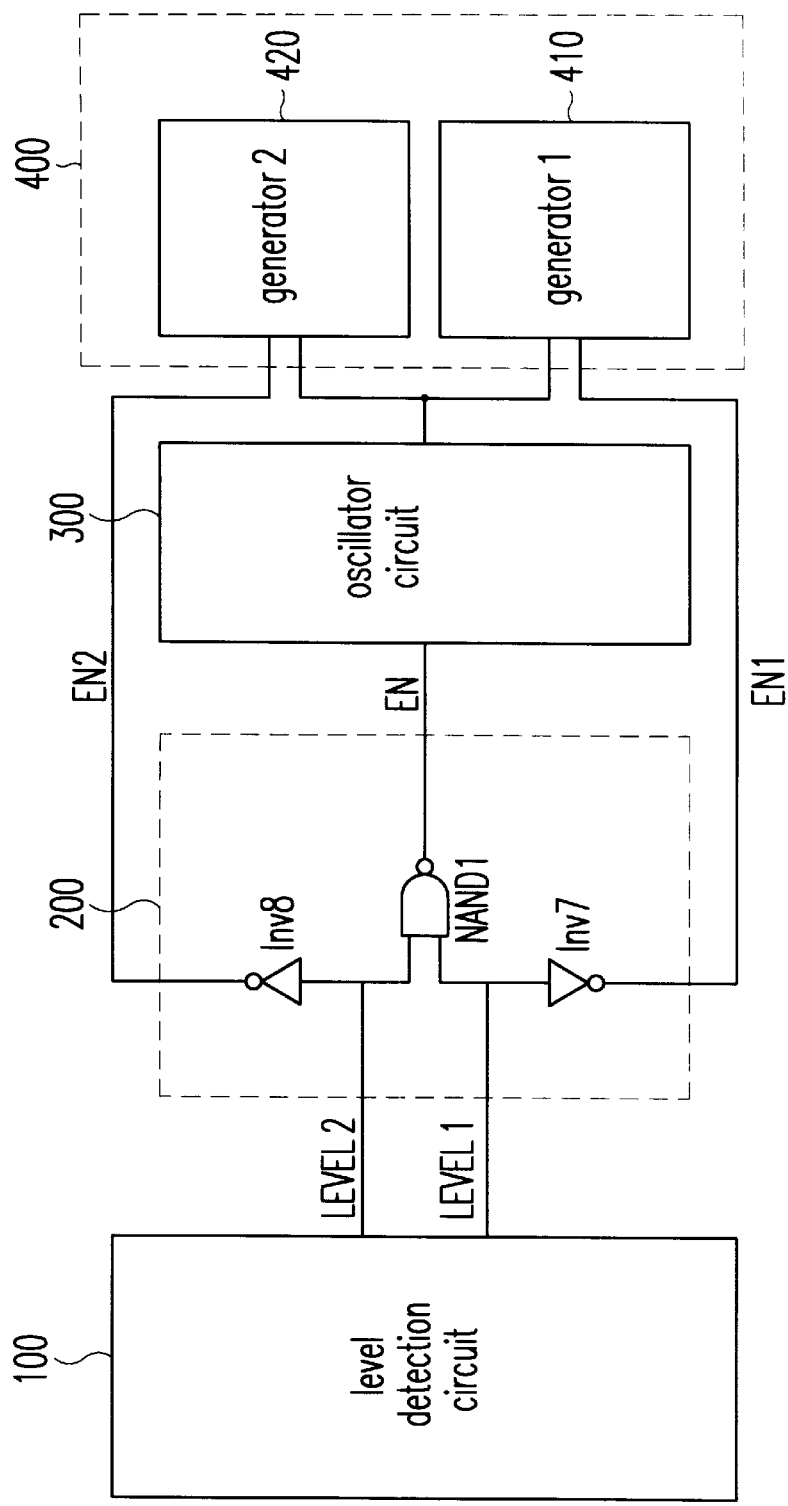
FIG. 8 is a block diagram of a control circuit block using NAND gate in accordance with the present invention.

FIG. 8 is a block diagram of a control circuit block 200 using NAND gate NAND1 in accordance with the present invention.

As shown in FIG. 8, the control circuit block 200 includes: a NAND gate NAND1 which receives level 1 and level 2 being outputted from the level detection circuit block 100 as an input, performs a NAND operation for the level 1 and level 2, and outputs an oscillator enable signal EN to an oscillation circuit block 300; an inverter INV7 which inverts the level 1 being outputted from the level detection circuit block 100, and outputs an enable signal EN1 to the first generator 410 of the generation circuit block 400; and an inverter INV8 which inverts the level 2 being outputted from the level detection circuit block 100, and outputs an enable signal EN2 to the second generator 420 of the generation circuit block 400.

As shown in FIGS. 7 and 8, since the present invention independently controls each of the generators 410 and 420, power-consumption is decreased. If a current level exceeds an allowable level (i.e., a level 1 in VPP, and a level 2 in VBB), the present invention drives all generators 410 and 420, thereby maintaining the current level within the allowable level. If the current level is within the allowable level, the present invention drives only one generator, thereby minimizing a level fluctuation.

Figure 9A:
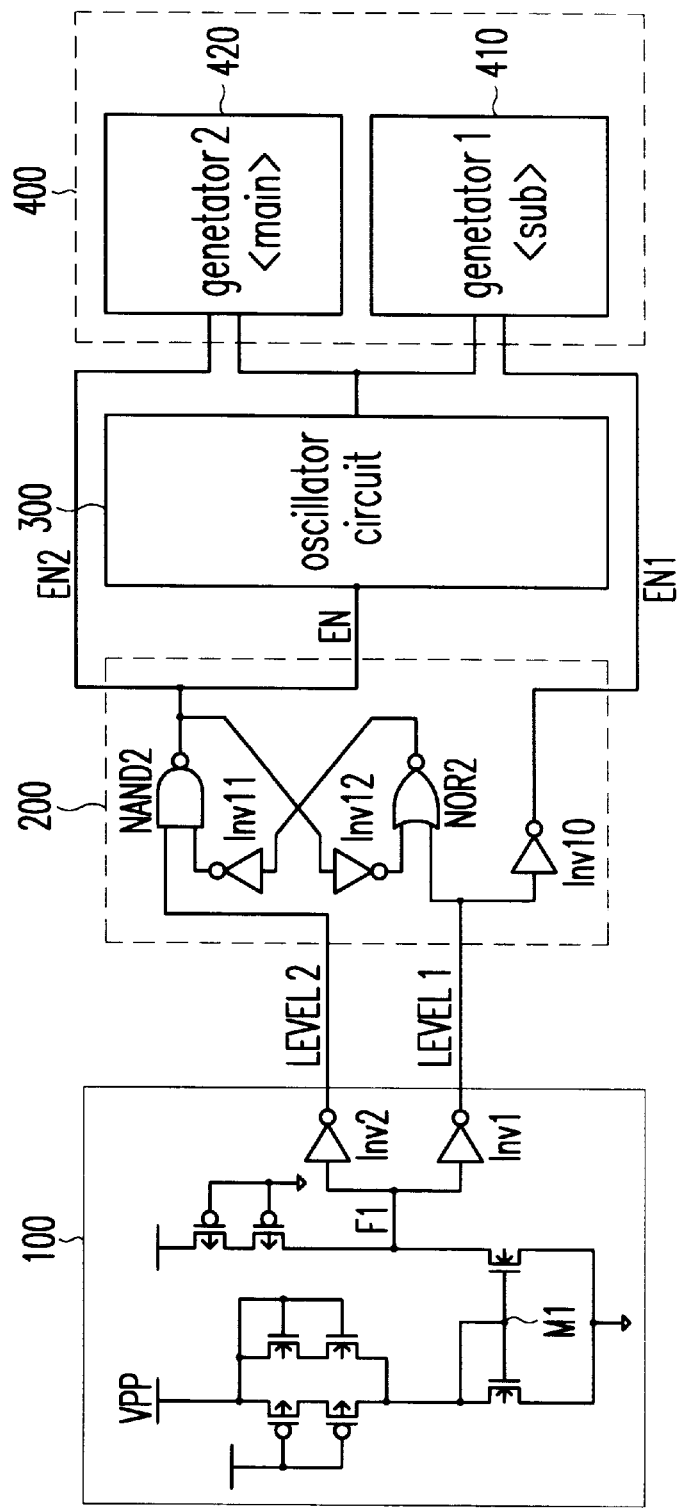
FIGS. 9A–9B illustrate a control circuit block using NOR gate and NAND gate in the step-up voltage (VPP) generation circuit in accordance with the present invention.
Figure 9B:
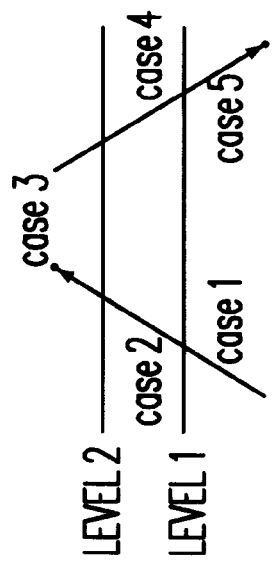

FIGS. 9A–9B illustrate a control circuit block 200 using NAND gate NAND2 and NOR gate NOR2 in the step-up voltage (VPP) generation circuit 100 in accordance with the present invention.

As shown in FIG. 9A, the control circuit block 200 includes:

a NOR gate NOR2 which receives level 1 generated from the level detection circuit block 100 through its one input terminal, and performs a NOR operation for level 1; a NAND gate NAND2 which receives a level 2 generated from the level detection circuit block 100 through its one input terminal, and performs a NAND operation for level 2; an inverter INV10 which inverts the level 1, and outputs an enable signal EN1 to first generator 410 of the generation circuit block 400; an inverter INV11 which inverts an output signal of the NOR gate NOR2, and outputs an inverted output signal of the NOR gate NOR2 to the other input terminal of the NAND gate NAND2; and an inverter INV12 which inverts an output signal of the NAND gate NAND2, and outputs an inverted output signal to the other input terminal of the NOR gate NOR2.

The NAND gate NAND2 transmits the oscillator enable signal EN to the oscillation circuit block 300, and simultaneously outputs an enable signal EN2 to the second generator 420 of the generation circuit block 400.

Operation states of the circuit of FIG. 9A are shown in FIG. 9B.

Figure 10A:
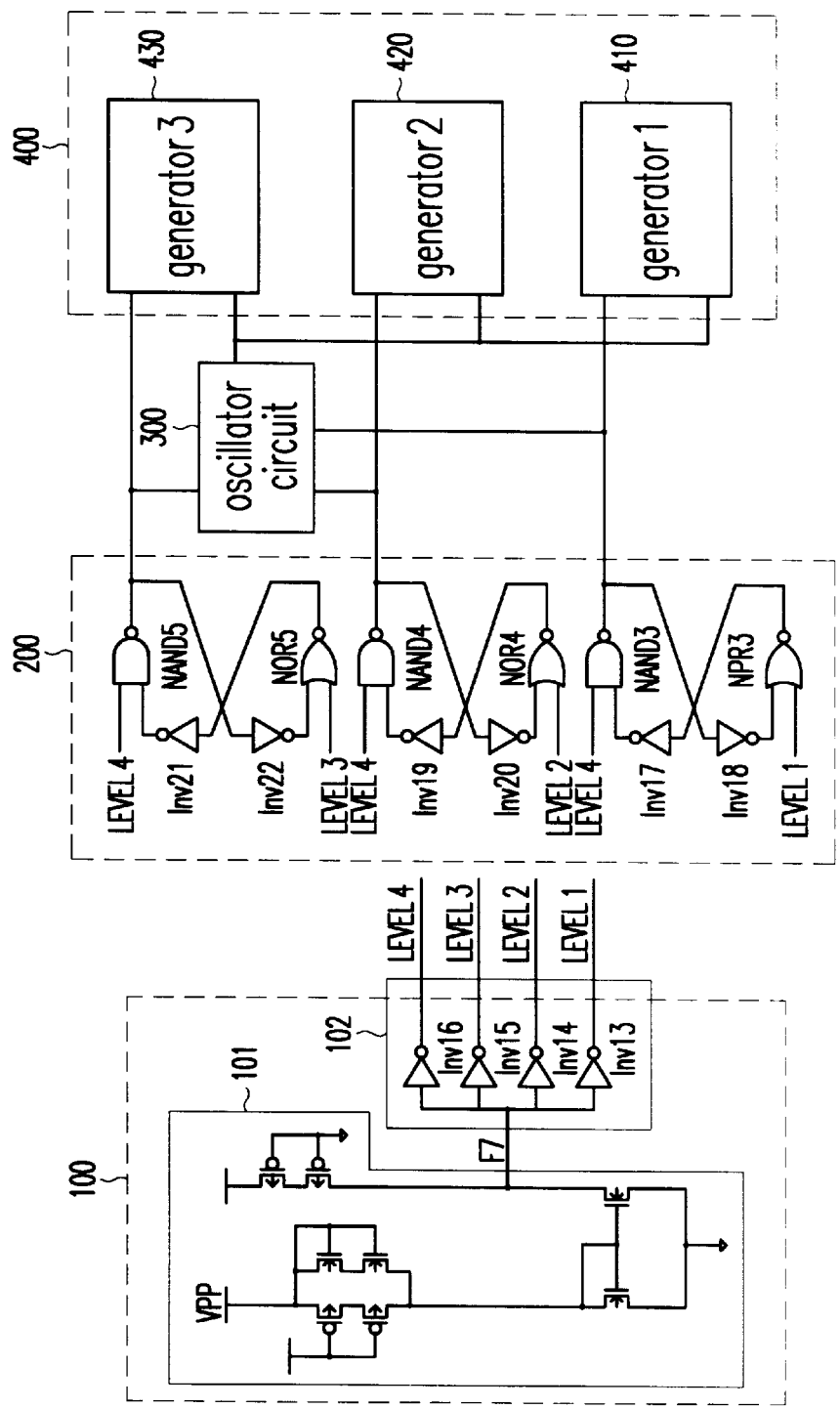
FIGS. 10A–10B illustrate a preferred embodiment of a circuit embodied by using the control circuit block of FIG. 9 in accordance with the present invention.
Figure 10B:
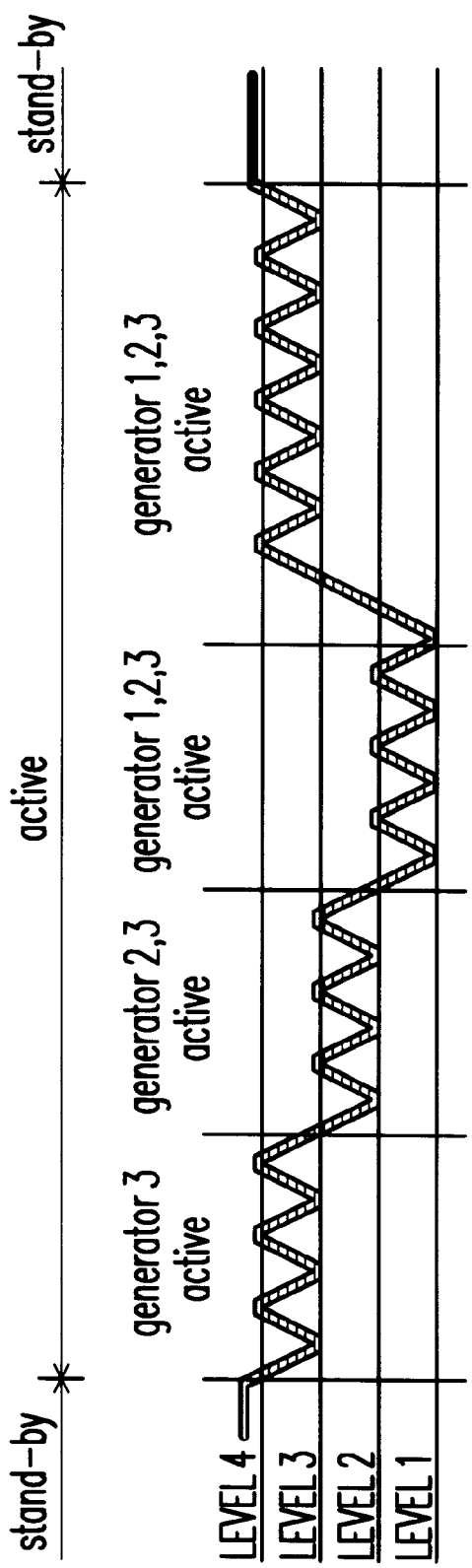
Figure 11A:
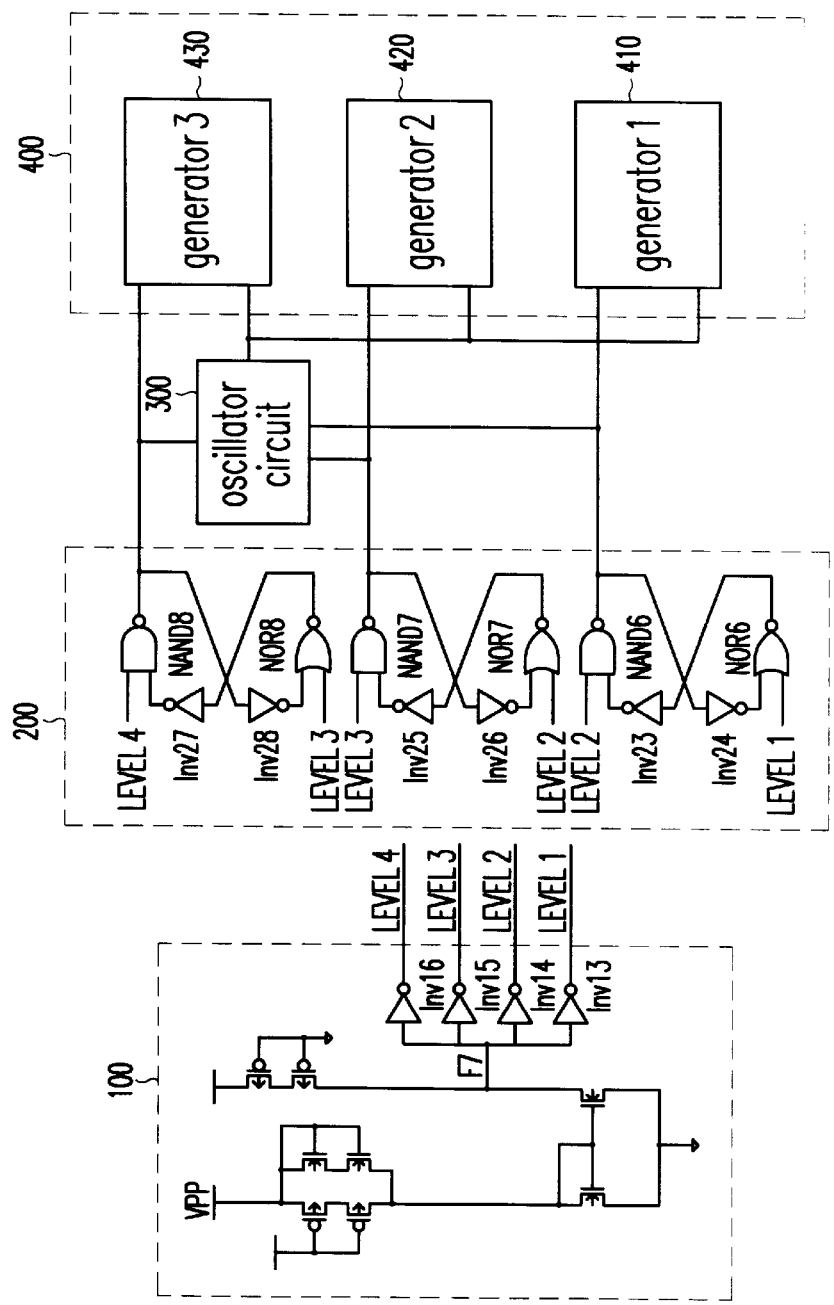
FIGS. 11A–11B illustrate another preferred embodiment of a circuit embodied by using the control circuit block of FIG. 9 in accordance with the present invention.
Figure 11B:
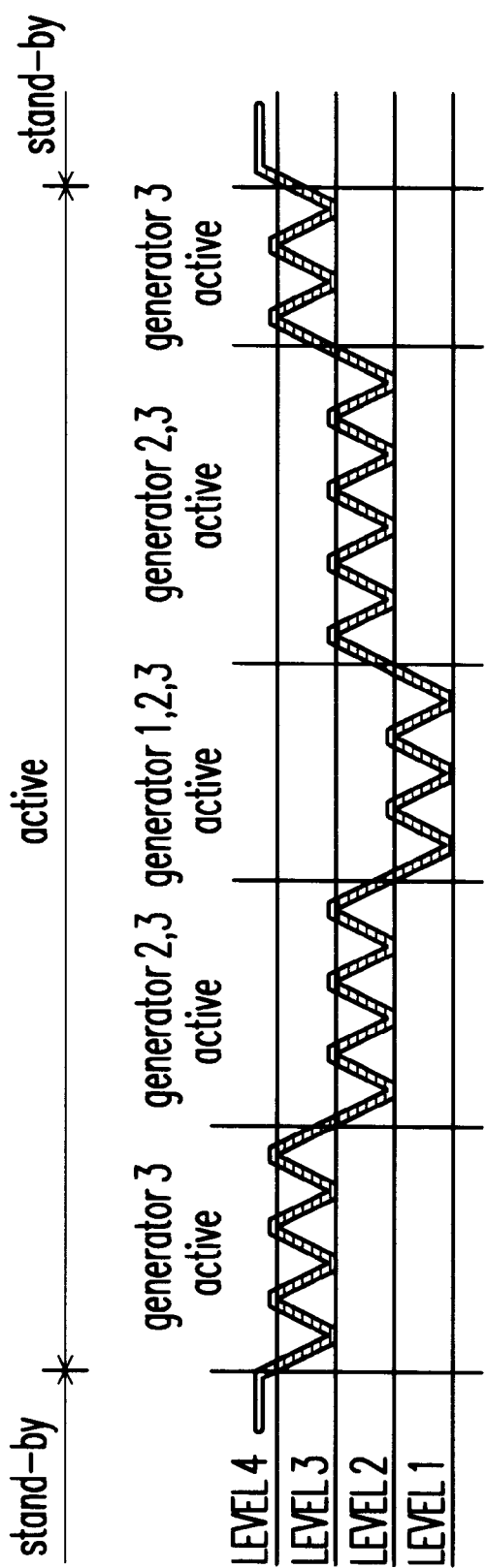

FIGS. 10A–10B illustrate a preferred embodiment of a circuit embodied by using the control circuit block of FIG. 9A in accordance with the present invention; and FIGS. 11A–11B illustrate another preferred embodiment of a circuit embodied by using the control circuit block of FIG. 9A in accordance with the present invention.

Referring to FIGS. 10–11, a level potential output portion 102 of a level detection circuit block 100 is constructed by pluralizing the inverters INV13–INV16 according to a desired level potential from level 1 to level 4. The control circuit block 200 is embodied by using the NAND gates NAND3–NAND8 and the NOR gates NOR3–NOR8, as shown in FIG. 9A.

Operation characteristics of the circuits of FIGS. 10A–11A are shown in FIGS. 10B–11B.

Figure 12A:
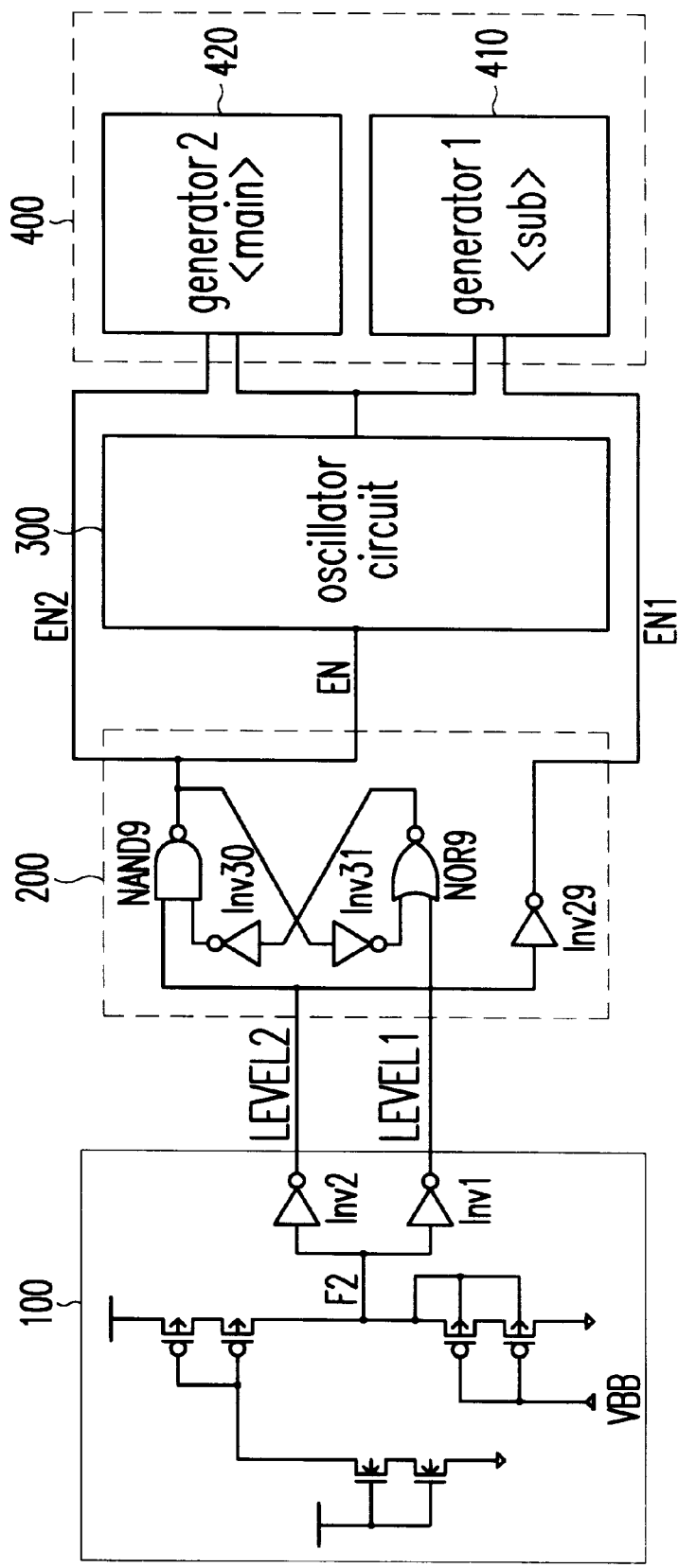
FIGS. 12A–12B illustrate a control circuit block using NOR gate and NAND gate in the back-bias voltage (VBB) generation circuit in accordance with the present invention.
Figure 12B:
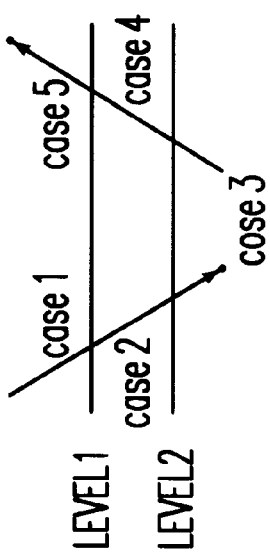

FIGS. 12A–12B illustrate a control circuit block 200 using NAND gate NAND9 and NOR gate NOR9 in the back-bias voltage (VBB) generation circuit 100. The circuit shown in FIG. 12A is identical with that of FIG. 9A.

Operation states of the circuit shown in FIG. 12A are shown in FIG. 12B.

Figure 13A:
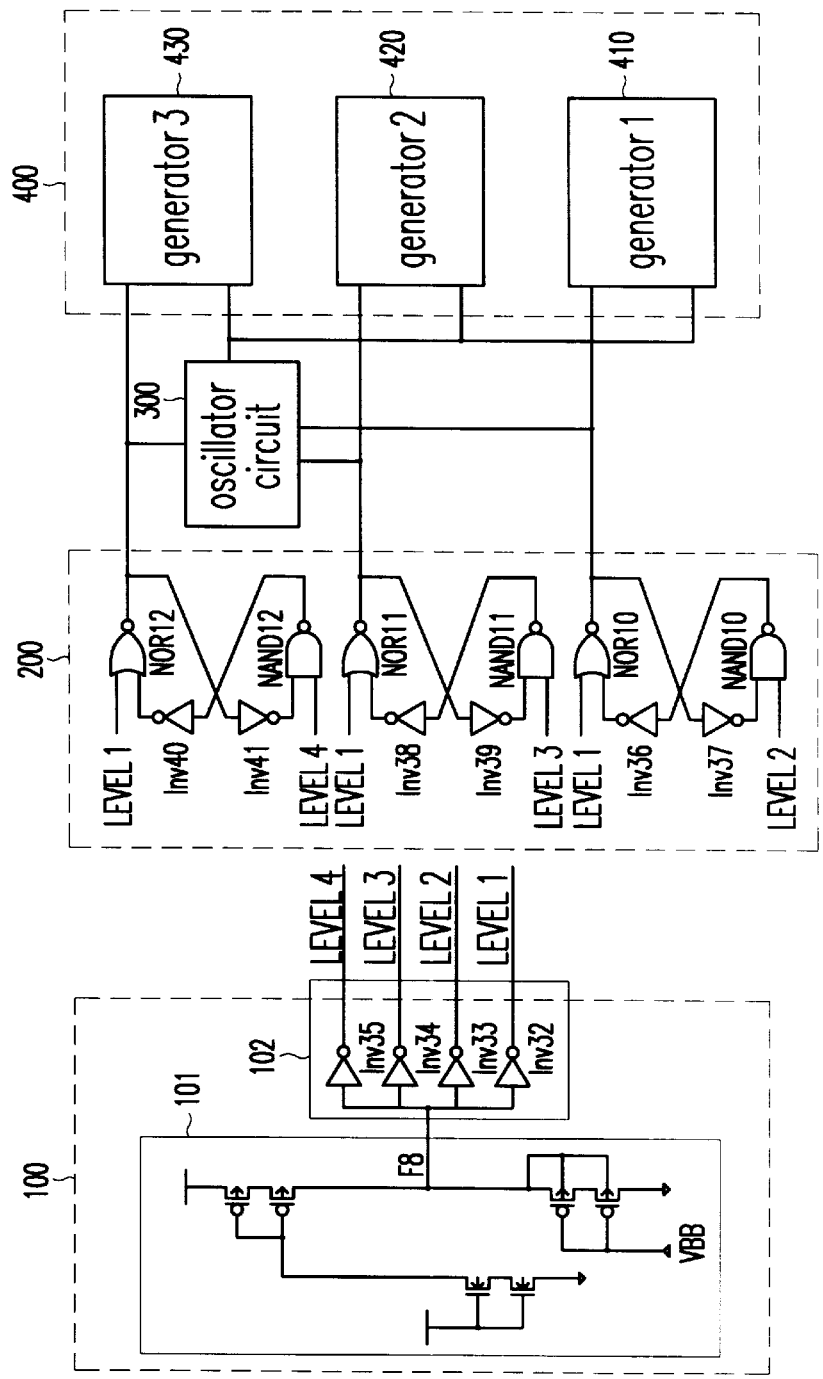
FIGS. 13A–13B illustrate a preferred embodiment of a circuit embodied by using the control circuit block of FIG. 12 in accordance with the present invention.
Figure 13B:
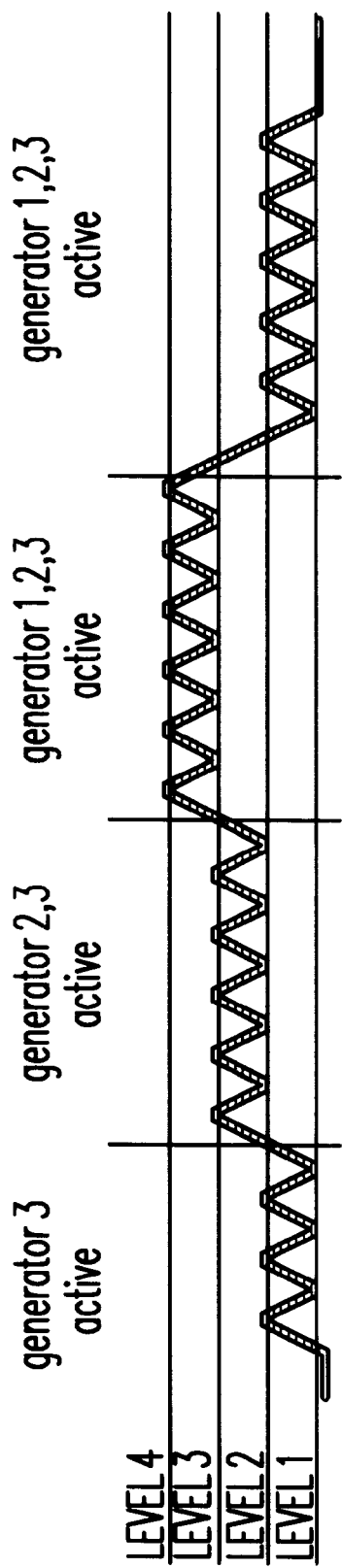
Figure 14A:
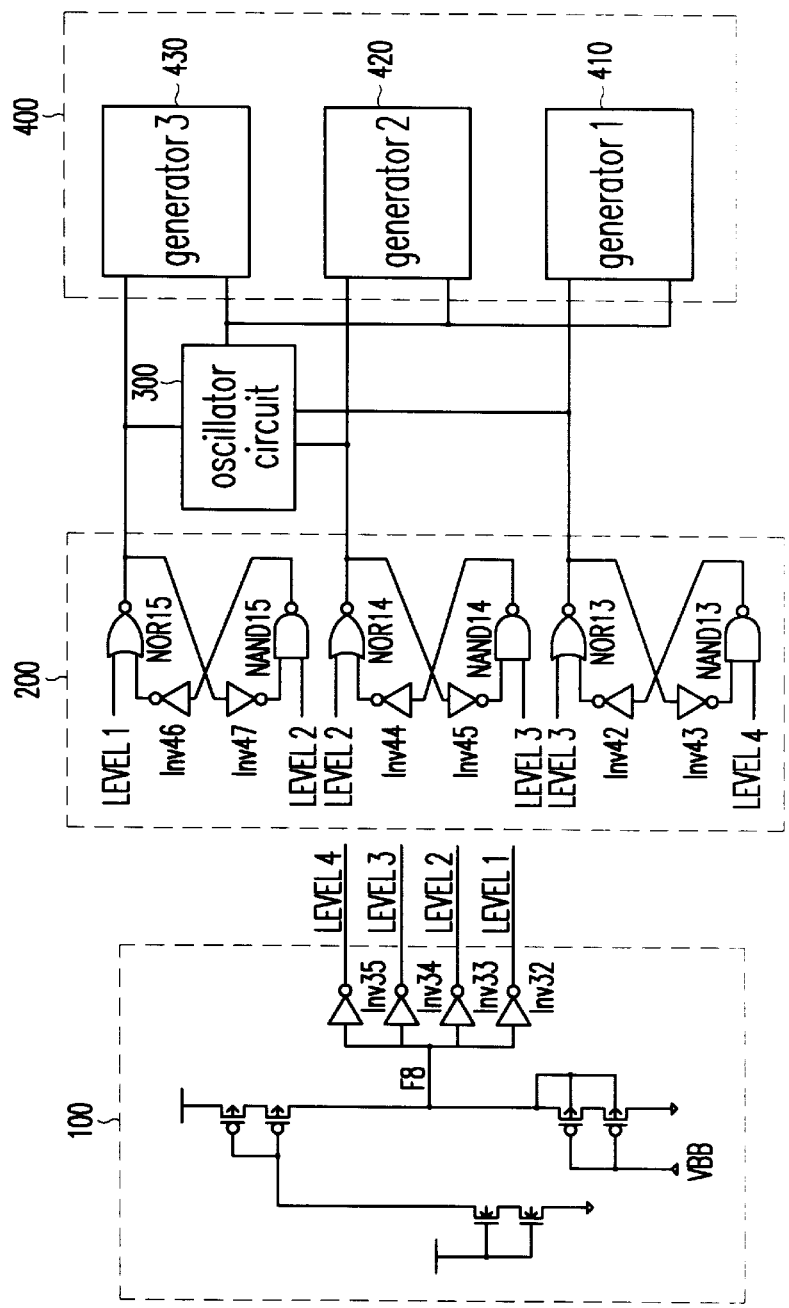
FIGS. 14A–14B illustrate another preferred embodiment of a circuit embodied by using the control circuit block of FIG. 12 in accordance with the present invention.
Figure 14B:
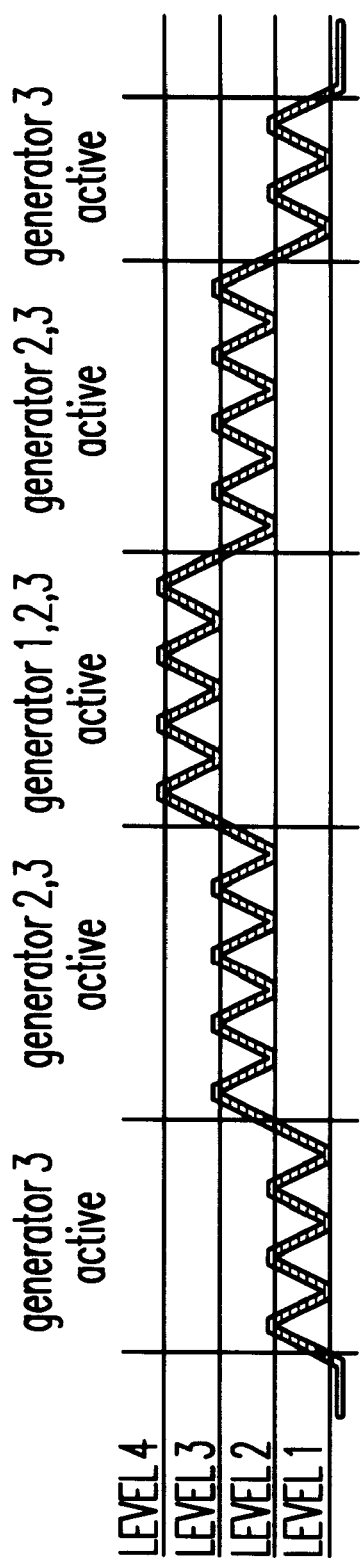

FIGS. 13–14 show operation characteristics of the circuit using the circuit of FIG. 12A.

A level potential output portion 102 of a level detection circuit block 100 is constituted by pluralizing the inverters INV32–INV35 according to a desired level potential from level 1 to level 4. The control circuit block 200 is embodied by using the NAND gates NAND10–NAND15 and the NOR gates NOR10–NOR15, as shown in FIG. 9A.

Operation characteristics of the circuit using the circuit of FIG. 12A are shown in FIGS. 13B–14B.

Figure 15:
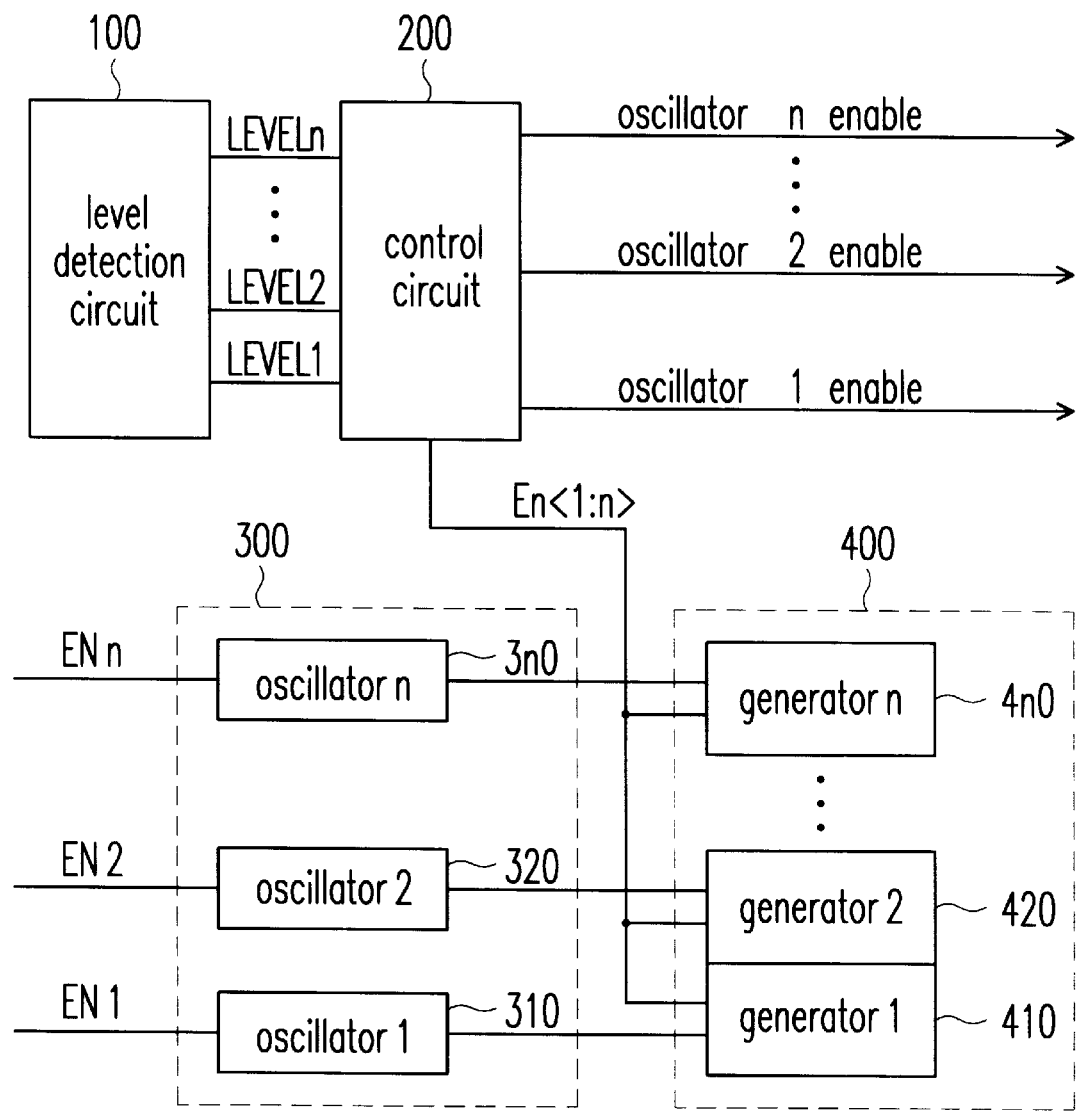
FIG. 15 illustrates another preferred embodiment of a circuit embodying a control method by a detection of N levels in accordance with the present invention.

FIG. 15 shows that N generators 410–430 of the generation circuit block 400 can be controlled by the control circuit block 200, if N levels from level 1 to level N are detected by the level detection circuit block 100.

As shown in FIG. 15, the control circuit block 200 independently controls each of N oscillators (310, 320, . . . , and 3n0), but all N oscillators (310, 320, . . . , and 3n0) are not required. Therefore, the oscillators can be reduced as a few blocks, or the circuit can be embodied by only one oscillator.

Figure 16:
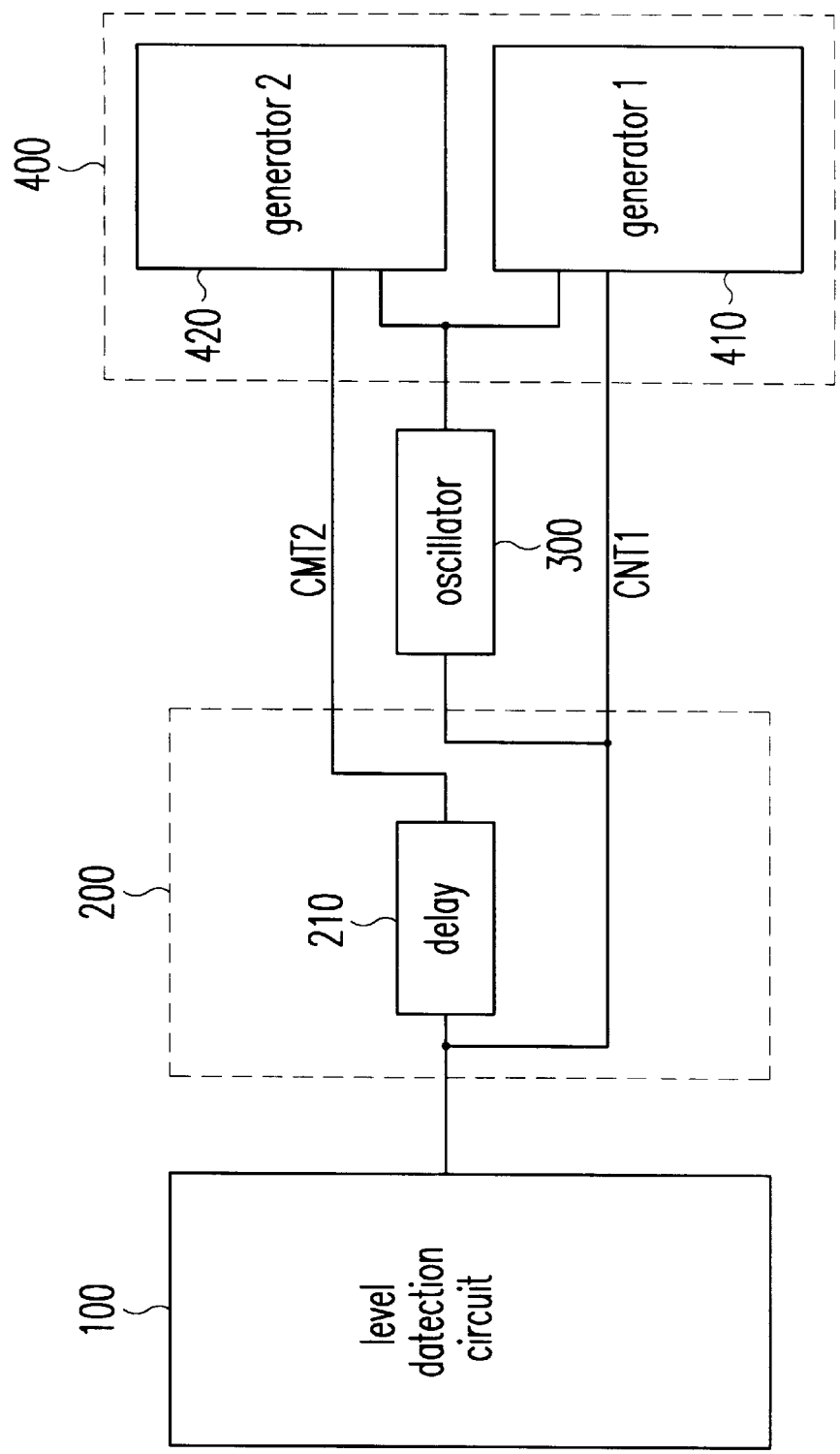
FIG. 16 is a block diagram of a multi-driving apparatus which shares an oscillator and uses a delay circuit in accordance with the present invention.

FIG. 16 shows that the control circuit block 200 is constituted by using a prior delay circuit 210, in which a multi-driving operation can be achieved by sharing an oscillator of the oscillation circuit block 300.

Figure 17:
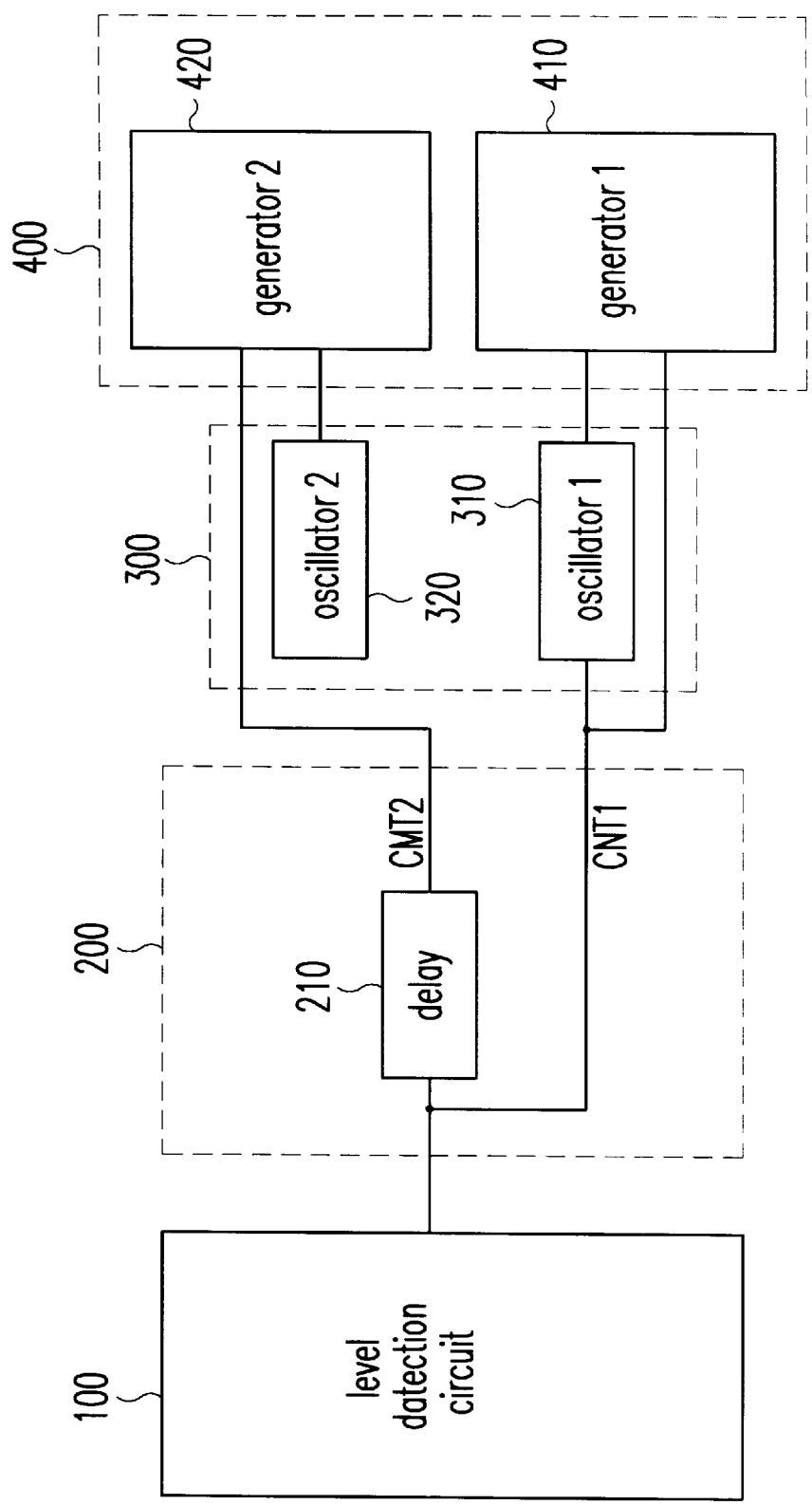
FIG. 17 is a block diagram of a multi-driving apparatus which uses a different oscillator and uses a delay circuit in accordance with the present invention.

FIG. 17 employs the same method as FIG. 16, but it shows a multi-driving structure without sharing oscillators 310 and 320 of the oscillation circuit block 300.

As described above, in order to eliminate a large fluctuation that occurs in a generator circuit during a chip operation, the present invention independently controls each generator circuit simultaneously with a pluralized detection level, thereby minimizing power-consumption.

As a result, since many problems caused by a step-up voltage/back-bias voltage fluctuation are resolved, product performance can be enhanced. The number of defective products can be reduced in a manufacturing process. Unnecessary pumping operation is prevented. And finally, power-consumption can be reduced.

In conclusion, the present invention minimizes a voltage level fluctuation by using a control structure by a multi-level detection, reduces noises influenced on a total operation of the apparatus, increases a reliability of the apparatus, and enhances a product performance.

In addition, since a highly effective generator on an operation of the apparatus stabilizes a level, the number of defective products due to a voltage fluctuation of the step-up voltage/back-bias voltage is decreased during the manufacturing process, thereby increasing the production yield.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed:

1. In a voltage generation method for a semiconductor element, a multi-driving method by a multi-level detection, comprising the steps of:

(a) detecting two or more different level potentials of one of a step-up voltage VPP and of a back-bias voltage VBB;

(b) generating a plurality of enable signals and a plurality of oscillator enable signals according to the different level potentials detected by the step (a);

(c) generating electric vibrations according to oscillations of oscillators driven by the plurality of oscillator enable signals generated by the step (b); and (d) driving one or more voltage generators by the electric vibrations generated from the step (c) and the plurality of enable signals generated from the step (b).

2. A multi-driving method by a multi-level detection as set forth in claim 1, when the step (a) detects the step-up voltage VPP, wherein the step (d) includes the steps of:

driving more voltage generators when receiving the enable signals generated by the low level potential than that when receiving the enable signals generated by the high level potential.

3. A multi-driving method by a multi-level detection as set forth in claim 1, when the step (a) detects the back-bias voltage VBB, wherein the step (d) includes the steps of:

driving more voltage generators when receiving the enable signals generated by the high level potential than that when receiving the enable signals generated by the low level potential.

4. A multi-driving method by a multi-level detection as set forth in claim 1, wherein the step (c) includes the step of:

driving the oscillators that are shared with each other.

5. A multi-driving method by a multi-level detection as set forth in claim 1, wherein the step (c) includes the step of:

independently driving the oscillators.

* * * * *